United States Patent [19]

Henein et al.

[11] 4,093,876

[45] June 6, 1978

[54] BASELINE RESTORER CIRCUIT

[75] Inventors: Kamal Labib Henein, Evry; Vsevolod Goursky, Paris, both of France

[73] Assignee: Commissariat a l'Energie Atomique, Paris, France

[21] Appl. No.: 757,016

[22] Filed: Jan. 5, 1977

[30] Foreign Application Priority Data

Jan. 12, 1976 France .................................. 76 00607

[51] Int. Cl.² .......................... H03K 1/14; H03K 5/08
[52] U.S. Cl. .................................... 307/264; 307/362; 328/162; 328/165; 328/171
[58] Field of Search ............... 328/162, 163, 165, 168, 328/171; 307/264, 362, 237; 178/7.3 DC, 7.5 DC; 358/34

[56] References Cited

U.S. PATENT DOCUMENTS 3,772,604  11/1973  Hogg et al. ....................... 328/162 X
3,895,305   7/1975  Longman, Jr. .................... 328/162 X Primary Examiner—John Zazworsky
Attorney, Agent, or Firm—Sidney W. Millard

[57] ABSTRACT

A resistor placed between the input and output of a first circuit has a low value when a control signal delivered by a threshold discriminator circuit has a first value and has a high value when the control signal has a second value. The input of an amplifier $A_3$ of the first circuit is connected through a switch either to the output of a first amplifier $A_1$ or to the output of a second amplifier $A_2$. The first amplifier has a negative input connected to a coupling capacitor of the first circuit and to the output of the amplifier $A_3$ and a positive input connected to ground. The amplifier $A_2$ has a negative input connected to the output of the amplifier $A_3$ and to ground and a positive input connected to the negative input of the amplifier $A_1$.

16 Claims, 6 Drawing Figures

BASELINE RESTORER CIRCUIT

This invention is concerned with a baseline restorer circuit and finds an application in electronics, especially in nuclear spectrometry chains.

Baseline fluctuations which appear at the output of the main amplifier of a spectrometry chain impair the resolution of the apparatus, mainly when the count rate attains a high value. These fluctuations are partly caused by capacitive couplings placed at different points of the spectrometry chain. These couplings introduce into the transfer function of the system poles of a disturbing nature which distort the unipolar form of the signal and give rise to the appearance of a long tail after each pulse. Statistical superposition of the tails is the cause of the phenomenon of fluctuation of the base level.

A technique of compensation of the charge preamplifier pole has been employed with a view to reducing the effect mentioned in the foregoing. This technique, however, lacks precision and gives rise to major difficulties of adjustment as a result of the non-linear behavior of the resistors of very high value which are mounted with negative feedback to the preamplifier. In consequence, compensation of the pole is achieved only in respect of a mean value of the time constants of the preamplifier and the signal delivered at the output of the main amplifier is never strictly unipolar.

Other sources of instability of the base level are related to the presence of parasitic low-frequency noise such as hum and Larsen effect. Noise of this type has the effect of broadening the peaks of the spectrum, even at a low count rate.

In order to remove parasitic low-frequency signals from the base level, two known systems can be employed:
 circuits placed at the output of the main amplifier which are accordingly designated as "restorers",
 or circuits which are connected in parallel with the amplifier and are designated as "stabilizers".

The present invention relates to a circuit of the first type, namely to a restorer which is therefore placed at the output of the main amplifier of the spectrometry chain. The function of said restorer is to eliminate slow fluctuations as well as low-frequency noise at the output of the amplifier. The restorer may virtually be considered as a non-linear high-pass filter having a cut-off frequency which varies according to the level of the input signal.

In one type of restorerf circuitf which is already known, a source of constant current is employed and delivers current only during the time-widths of the pulses applied to the circuit so as to charge the coupling capacitor during each pulse. This type of restorer has a disadvantage in that it results in attenuation of the amplitude of the pulses, in non-linearity and in a longer restitution time. In consequence, the resolution is fairly rapidly impaired as a function of the count rate.

On the subject of a known technique of this kind, reference can usefully be made by way of example to the article by L.B. Robinson entitled "Reduction of baseline shift in pulse amplitude measurement" published in the "Review of Scientific Instruments", 32, 1057 (1961), the article by Chase and Poulo entitled "A high-precision DC restorer", published in "IEEE" Trans. Nucl. Sci. NS 14, No 1, 1967 and the article by C.W. Williams entitled "Reducing pulse-height spectral distortion by means of DC restoration and pile-up rejection", published in "IEEE" Trans. Nucl. Sci. NS 15, No 1 (1968) 297.

The baseline restorer in accordance with the invention circumvents the disadvantages mentioned in the foregoing since it does not make use of a constant current source during the time-widths of the pulses but calls for the use of a resistive circuit which can assume two different values according as a pulse is present or not at its input.

Circuits of this type are already known: reference may be made in this connection to the article published in "Nuclear Instruments and Methods", volume 100, No 2 of Apr. 15, 1972, pages 349–353, and entitled "A flexible baseline restorer". The present invention is characterized by the particular method of construction of the resistive circuit which can assume two different values.

In precise terms, the invention has for its object a baseline restorer circuit of the type comprising:
 a first circuit having an input connected to a coupling capacitor, an output connected to ground and a control lead to which is applied a control signal which is capable of assuming either a first value or a second value, said first circuit being provided between the input and the output thereof with a resistor having a value of resistance equal either to a first value $R_0$ of a low order when the control signal assumes its first value or to a second value $R_\infty$ which is considerably higher than $R_0$ when the control signal assumes its second value,
 a second circuit of the threshold discriminator type whose input is connected to the input of the first circuit aforesaid and whose output is connected to the control lead aforesaid, said second circuit being capable of delivering at its output said control signal whose first value is obtained when the voltage applied to the input of the second circuit is lower than a threshold value and whose second value is obtained when the voltage applied to the input is higher than said threshold value, and the baseline restorer circuit is characterized in that said first circuit comprises an amplifier $A_3$ whose input is connected through a switch having two inputs and one output either to the output of a first amplifier $A_1$ or to the output of a second amplifier $A_2$, said switch being provided with a contro lead which constitutes the control lead of said first circuit, said amplifier $A_1$ being provided with a negative input connected on the one hand to said capacitor through an input resistor $R_e$ and on the other hand to the output of the amplifier $A_3$ through a resistor $R_f$ and a positive input connected to ground, said amplifier $A_2$ being provided with a negative input connected on the one hand to the output of the amplifier $A_3$ and on the other hand to ground through a resistor $R_g$ and a positive input connected to the negative input of the amplifier $A_1$.

The distinctive features and advantages of the invention will in any case become more readily apparent from the following description of exemplified embodiments which are given by way of explanation and not in any limiting sense, reference being made to the accompanying drawings, in which.

Figure 1:
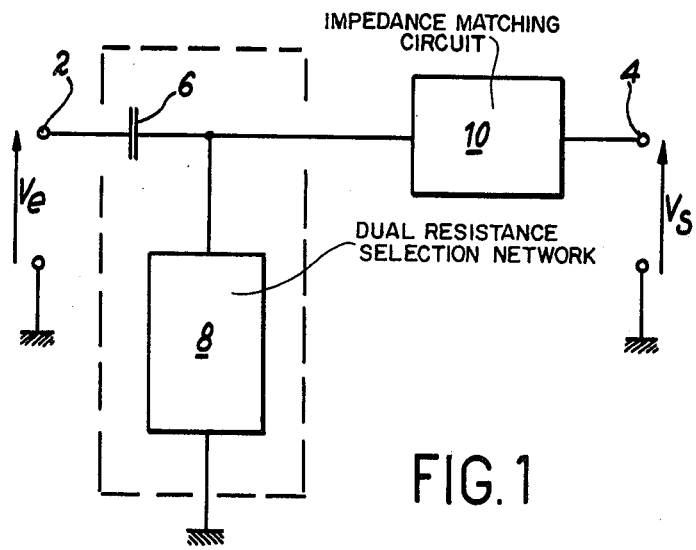
FIG. 1 is a block diagram of the baseline restorers of the type contemplated by the invention.

There is shown in FIG. 1 a block diagram of the baseline restorer circuits of the same type as those of the invention. This circuit comprises very schematically : an input 2, the input voltage Ve delivered by a main amplifier (not shown) being applied to the terminals of said input 2, and an output 4 which delivers a voltage Vs. There are placed between the input and ground a coupling capacitor having a value C and designated by the reference 6, and a circuit 8 which can have two values of resistance, namely a very low first value $R_0$ and a very high second value $R_\infty$ ; if so required, an impedance-matching circuit 10 can be placed between the circuit 8 and the output 4.

In broad outline, the operation of a circuit of this type is as follows : when no pulse is applied to the input 2, the noise level is usually lower than a predetermined threshold value. The resistance of the circuit 8 then assumes the value $R_0$ and the time constant of the assembly formed by the capacitor 6 and the resistive circuit 8 is equal to $T_0 = R_0C$ ; this corresponds to a cut-off frequency which is equal to $1/R_0C$. The slow noise components which appear downstream of the coupling capacitor are therefore filtered with a greater degree of efficiency when the frequency of said components is lower than said cut-off frequency.

In the presence of a pulse whose amplitude exceeds the threshold level, the circuit 8 changes state and assumes a very high value of resistance $R_\infty$. The time constant $T_\infty = R_\infty C$ then becomes very substantial and the cut-off frequency comes close to 0. In consequence, the components of the signal undergo attenuation of only a very low order.

At the end of the pulse applied to the input, the restitution circuit 8 returns to its initial state and the resistance is restored to its value $R_0$. The low charge stored within the capacitor 6 during the length of the pulse is removed in accordance with an exponential law in which the time constant is equal to $T_0=R_0C$. A short tail follows each pulse with an amplitude and a speed of return to the base level which are respectively proportional to $1/T_\infty$ and $1/T_0$.

In order to weaken the tail just mentioned and also in order to accelerate the restitution, the ratio $T_\infty/T_0$ must be as high as possible, thereby improving at the same time the efficiency of the restorer, especially at high count rates.

Figure 2:
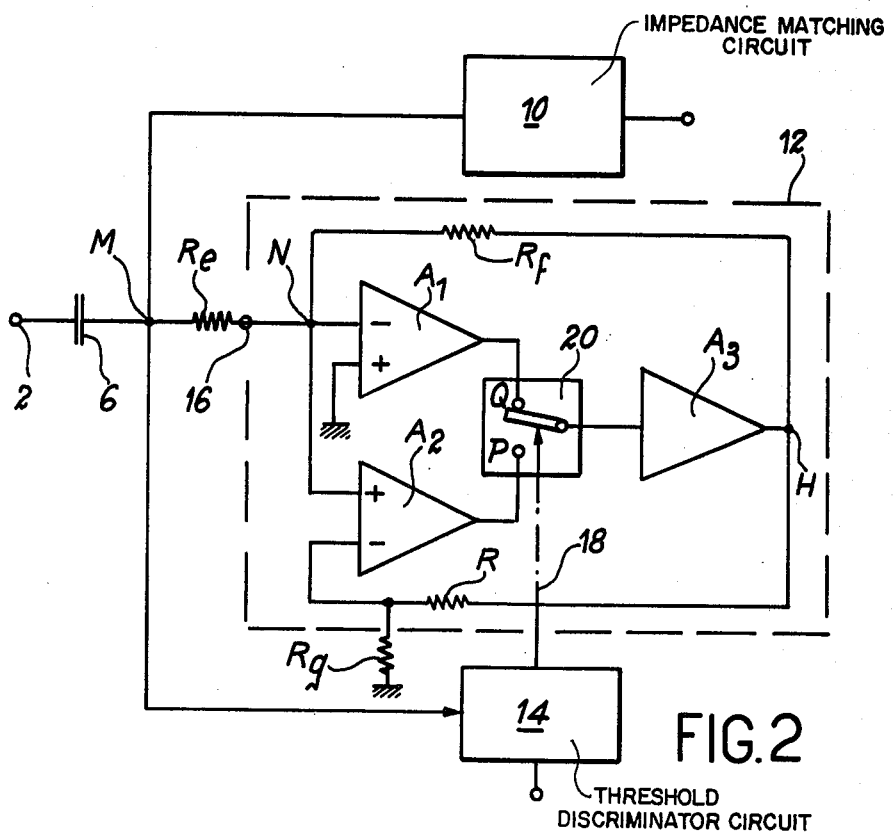
FIG. 2 is a schematic diagram of the restorer circuit in accordance with the invention.
Figure 5:
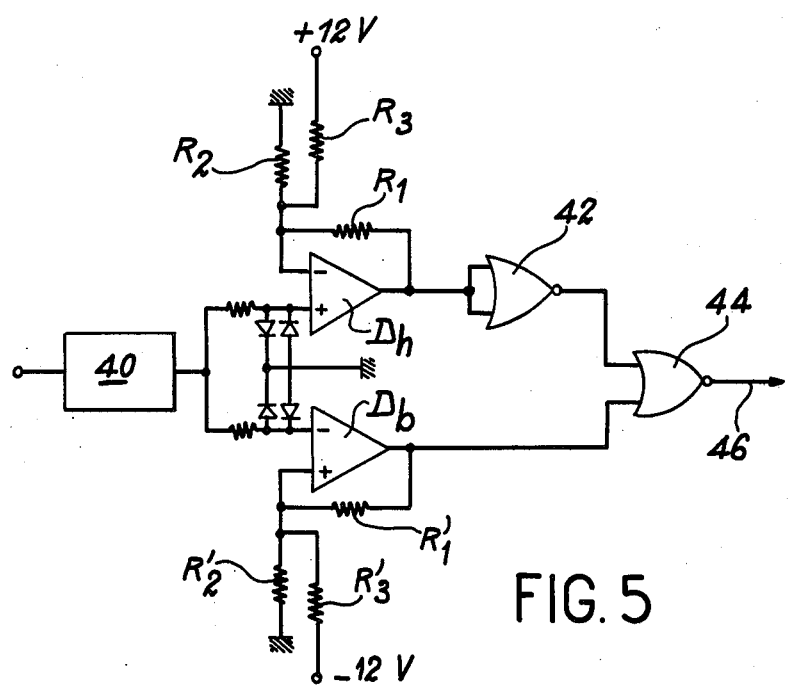
FIG. 5 shows a particular form of construction of a bipolar discriminator circuit which can be substituted for the unipolar circuit of the previous figure.

FIG. 2 represents the structure of the baseline restorer circuit according to the invention. Said restorer mainly comprises two circuits : the first circuit designated by the reference 12 is the circuit which can have the two values of resistance $R_0$ and $R_\infty$ and the second circuit designated by the reference 14 is a discriminator circuit, the detailed structure of which will be described with reference to FIGS. 4 and 5. The impedance-matching circuit 10 and the discriminator circuit 14 are conventional and well known to anyone versed in the art. The invention is therefore essentially characterized by the circuit 12 employed in combination with known circuits of this type.

The circuit 12 has an input 16 and a control lead 18. The input 16 is connected to the capacitor 6 through an input resistor $R_e$. The control lead 18 is connected to the discriminator circuit 14. The circuit 12 is made up of three amplifiers $A_1$, $A_2$, $A_3$. The input of the amplifer $A_3$ is connected either to the output of the amplifier $A_1$ or to the output of the amplifier $A_2$, depending on the state of a switch 20 having two inputs and one output. Said switch is controlled by the signals carried by the control lead 18.

A resistor $R_f$ is connected between the negative input of the amplifier $A_1$ and the output of the amplifier $A_3$ and a resistor R is connected between the negative input of the amplifier $A_2$ and the output of the amplifier $A_3$. The negative and positive inputs of the amplifiers $A_1$ and $A_2$ are connected together.

In order to ensure greater clarity of the description in regard to the operation of a circuit of this type, references are provided at certain points of the circuit (M, N and H) and at the inputs of the switch (P and Q).

The operation of a circuit of this type is as follows: when no pulse is applied to the input 2, the switch 20 is in its position Q (this is the case illustrated in FIG. 2) and the amplifiers $A_1$, $A_3$ are connected in series and in negative feedback through the resistor $R_f$. The point N thus represents the fictitious ground, with the result that the time constant $T_0$ of said circuit is equal to $CR_e$.

In the presence of a pulse which appears at the input 2, the discriminator circuit 14 modifies the value of the control signal carried on the lead 18, thus initiating changeover of the switch 20 which then moves to position P. The amplifiers $A_1$ and $A_3$ are disconnected and the point N no longer represents the fictitious ground. On the other hand, the amplifiers $A_2$ and $A_3$ are accordingly connected in series and in feedback through the resistor R. The signals at each terminal of the resistor $R_f$ are therefore practically equal. The effective value of the resistor $R_f$ then becomes equal to $R_f A_2 A_3$, where $A_2 A_3$ is the open-loop gain of the series amplifiers $A_2$ and $A_3$.

Thus in the absence of pulses, the time constant $T_0$ is equal to $CR_e$ and changes to the value $T_\infty = C(R_e + R_f A_2 A_3)$ when a pulse is present. The ratio of these two time constants is therefore :

$$\frac{T_\infty}{T_0} = 1 + \frac{R_f}{R_e} A_2 A_3$$

This ratio can theoretically tend towards infinity by adding a resistor $R_g$ having a high value of resistance and placed between the negative input of the amplifier $A_2$ and ground. Taking this resistance $R_g$ into account, the new ratio $T_\infty/T_0$ would be $$\frac{T_\infty}{T_0} = 1 + \frac{R_f}{R_e} \frac{A_2 A_3}{1 - A_2 A_3 \frac{(R)}{(R_g)}}$$

By adjusting the value of $R_g$ so that this latter approximates to the value of the open-loop gain $A_2A_3$, the ratio of the time constants $T_\infty/T_0$ tends towards infinity, which is one of the advantages offered by the circuit in accordance with the invention.

The output signal of the circuit shown in FIG. 2 can be collected either directly at the output of the amplifier $A_3$ (point H), in which case it is preferable to ensure that the ratio $R_f/R_e$ is equal to unity so that the background noise level should remain unchanged when no pulses are delivered or at the point M through an impedance-matching circuit 10, thus leaving a greater freedom of choice in respect of the value of $R_f$.

Figure 3:
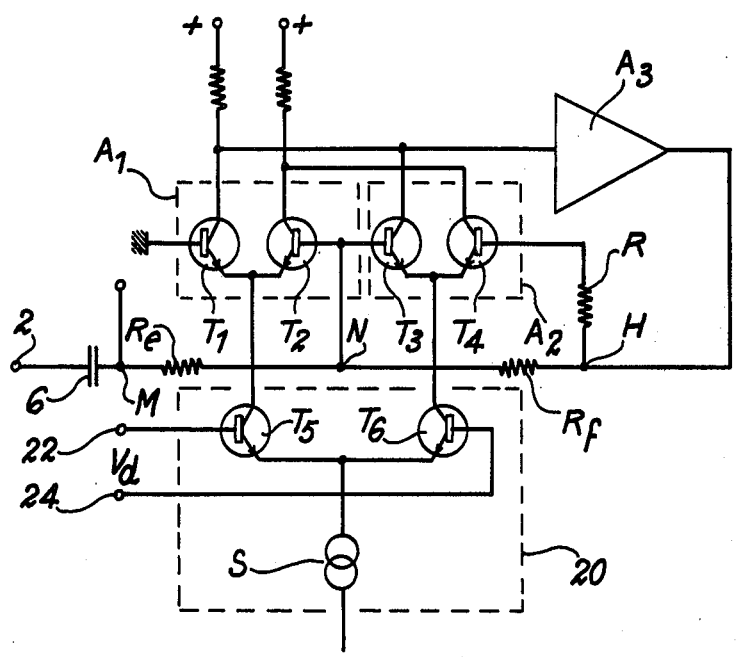
FIG. 3 shows a particular form of construction of said circuit.
Figure 6:
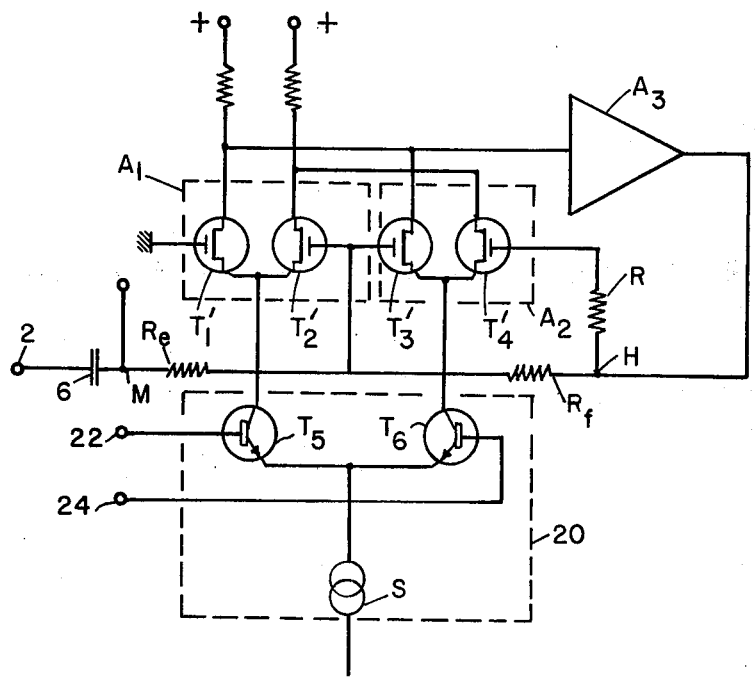
FIG. 6 shows an alternate embodiment of the first circuit described in connection with FIG. 3.

FIG. 3 is a schematic diagram of the circuit 12 in a preferred embodiment which is given by way of illustration. In this circuit, the amplifier $A_1$ is made up of a differential circuit comprising two paired bipolar transistors $T_1$ and $T_2$ and the amplifier $A_2$ is constituted by another differential circuit comprising two paired bipolar transistors $T_3$ and $T_4$. The amplifier $A_3$ is a conventional high-gain amplifier, one example of construction of this latter being illustrated in FIG. 4. The switching circuit 20 is constituted by a differential circuit comprising two transistors $T_5$ and $T_6$ associated with a current source S. This switching circuit is controlled by means of a signal applied between the terminals 22 and 24 in the form of a voltage $V_d$ delivered by the discriminator circuit which will be described below with reference to FIG. 4. Looking to FIG. 6, an alternative arrangement for the differential circuits of amplifiers $A_1$ and $A_2$ is revealed. In the drawing, field-effect transistors $T_1'$ and $T_2'$ are utilized to form the differential circuit of amplifier $A_1$, while field-effect transistors $T_3'$ and $T_4'$ are incorporated to form the differential circuit of amplifier $A_2$.

The operation of a circuit of this type is as follows. When there is no pulse applied to the input 2, the discriminator circuit delivers a differntial voltage $V_d$ such that the base of the transistor $T_6$ is more negative than that of the transistor $T_5$. The entire current delivered by the source S then passes through the transistor $T_5$ and the transistor $T_6$ remains in the non-conducting state. The differential circuit $T_1 - T_2$ is therefore in the conducting state and the differential circuit $T_3 - T_4$ is in the non-conducting state. The point N thus has the fictitious ground of the amplifiers $A_1$ and $A_3$ which are placed in series.

Figure 4:
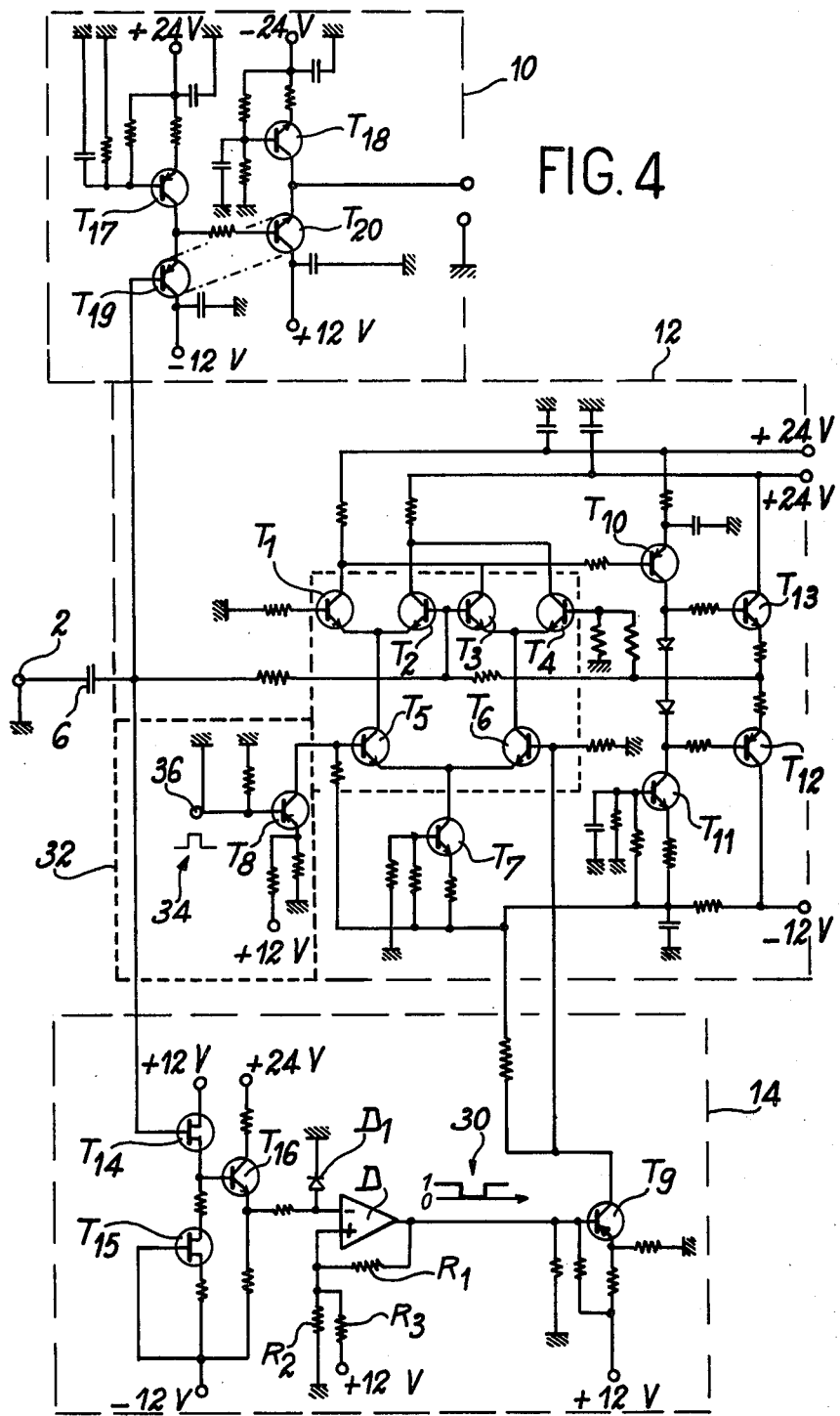
FIG. 4 shows a particular form of construction of the complete restorer according to the invention in the case in which the discriminator circuit is unipolar.

In the presence of a pulse, the discriminator circuit changes its initial state and produces another differential voltage $V_d$ such that the base of the transistor $T_6$ is positive with respect to the base of the transistor $T_5$. The entire current delivered by the source S then passes through the transistor $T_6$. The states of the differential circuits are reversed : the differential circuit $T_3 - T_4$ changes to the conducting state whereas the differential circuit $T_1 - T_2$ is caused to cut-off. The voltage of the point N is thus exactly equal to that of the point H. In consequence, the effective value of the resistance $R_f$ and the time constant increase to a considerable extent. FIG. 4 illustrates a particular form of construction of the baseline restorer in accordance with the invention. This diagram reproduces the structures the amplifiers $A_1$, $A_2$ and of the switching circuit which are already illustrated in FIG. 3 and further shows one example, first of construction of the amplifier, $A_3$; second, of the discriminator circuit, and third of the output impedance-matching circuit.

The amplifier $A_3$ is constituted by the transistors $T_{10}$, $T_{11}$, $T_{12}$ and $T_{13}$.

The matching circuit 10 comprises two successive emitter-followers. The first emitter-follower is a *p-n-p* transistor designated by the reference $T_{19}$, the second emitter-follower is an *n-p-n* transistor $T_{20}$. This circuit arrangement makes it possible to obtain an output voltage in the vicinity of 0 in the quiescent state and to compensate for the thermal drift produced by each base-emitter junction through that of the other junction. The constant-current generators $T_{17}$ and $T_{18}$ are intended to suppress any variation in base current of the emitter-followers as a function of the level of the signal in order to increase the input resistance.

Said matching circuit can also be replaced by an equivalent arrangement which employs paired field-effect transistors such as the arrangement represented by the transistors $T_{14}$ $T_{15}$ in FIG. 4.

The discriminator circuit 14 is suitable only for positive unipolar pulses. In order to isolate the point M of the low input impedance of the discriminator D, an impedance matching circuit made up of two field-effect transistors $T_{14}$ and $T_{15}$ is employed at the input of the circuit. The configuration of the system of resistors $R_1$, $R_2$, $R_3$ defines a threshold voltage of approximately 50 millivolts and produces a reaction between the positive input and output of the discriminator D. This configuration accelerates reversal and prevents oscillations which are produced when the level of the signal at the input is equal to the threshold level. In the quiescent state, the output of the discriminator D is at the logical level 1 but changes into the level 0 in the presence of a positive pulse at the input as shown in the diagram 30. The sole object of the diode $D_1$ is to protect the discriminator from any signal having a level which is higher than the maximum differential voltage of the discriminator.

The control signal 30 is applied to a transistor $T_9$ which is caused to cut-off when no pulse is applied to the input. When a positive pulse appears, the discriminator changes from state 1 to state 0 and the transistor $T_9$ is caused to conduct, thus producing a positive pulse on the base of the transistor $T_6$. This has the effect of initiating a change of state of the differential circuit $T_5 - T_6$ as explained earlier in connection with FIG. 3.

If so required, a zero-reset circuit 32 can be employed and a zero-reset pulse 34 can be applied to the transistor $T_8$ on the external control input 36 in order to restore the differential circuit $T_5 - T_6$ to its initial state.

The discriminating circuit 14 shown in FIG. 4 operates if the input pulses are positive. When the input signal is bipolar, said discriminating circuit can be replaced by a circuit of the type shown in FIG. 5. It is composed of a high discriminator $D_h$ which detects the positive signal and has a threshold of approximately + 50 millivolts, and of a low discriminator $D_b$ which detects the negative signal and has a threshold of approximately − 50 millivolts. The restorer has a short time constant between + 50 mV and − 50 mV. Outside this zone, the time constant is very long. The discriminator is completed by an impedance-matching circuit 40 and by logical gates 42 and 44 of the NOR type. When this circuit is employed, its output 46 is applied to the base of the transistor $T_9$ shown in FIG. 4.

What we claim is:

1. A baseline restorer circuit of the type comprising:
a first circuit having an input connected to a coupling capacitor, an output and a control lead to which is applied a control signal which is capable of assuming either a first value or a second value, said first circuit being provided between the input and the output thereof with a resistor having a value of resistance equal either to a first value $R_0$ of a low order when the control signal assumes its first value or to a second value $R_\infty$ which is considerably higher than $R_0$ when the control signal assumes its second value, a second circuit of the threshold discriminator type whose input is connected to the input of the first circuit aforesaid and whose output is connected to the control lead aforesaid, said second circuit being capable of delivering at its output said control signal whose first value is obtained when the voltage applied to the input of the second circuit is lower than a threshold value and whose second value is obtained when the voltage applied to the input is higher than said threshold value, wherein said first circuit comprises an amplifier $A_3$ whose input is connected through a switch having two inputs and one output either to the output of a first amplifier $A_1$, or the output of a second amplifier $A_2$, said switch being provided with a control lead which constitutes the control lead of said first circuit, said amplifier $A_1$ being provided with a negative input connected on the one hand to said capacitor through an input resistor $R_e$ and on the other hand to the output of the amplifier $A_3$ through a resistor $R_f$ being provided with a positive input connected to a reference point, said amplifier $A_2$ being provided with a negative input connected to the output of the amplifier $A_3$ and additionally to a reference point through a resistor $R_g$ and a positive input connected to the negative input of the amplifier $A_1$.

2. A restorer circuit according to claim 1, wherein the amplifier $A_1$ comprises a differential circuit having two paired bipolar transistors $T_1$ and $T_2$ in which emitters are jointed together, the base of the transistor $T_1$ being such as to constitute the positive input and the base of the transistor $T_2$ being such as to constitute the negative input.

3. A restorer circuit according to claim 1, wherein the amplifier $A_2$ comprises a differential circuit having two paired bipolar transistors $T_3$ and $T_4$ in which the emitters are joined together, the base of the transistor $T_3$ being such as to constitute the positive input and the base of the transistor $T_4$ being such as to constitute the negative input.

4. A restorer circuit according to claim 2 wherein the collectors of the transistors $T_2$ and $T_4$ are connected together, the amplifier $A_3$ being connected to the collectors of the transistors $T_1$ and $T_3$.

5. A restorer circuit according to claim 4, wherein the switch is constituted by a differential circuit having two transistors $T_5$ and $T_6$ in which the emitters are connected to a current source and in which the bases receive said control signal, the collector of the transistor $T_5$ being connected to the associated emitters of the transistors $T_1$ and $T_2$ and the collector of the transistor $T_6$ being connected to the associated emitters of the transistors $T_3$ and $T_4$.

6. A restorer circuit according to claim 1, wherein the output of the restorer circuit is taken between said input resistor $R_e$ and the capacitor.

7. A restorer circuit according to claim 6, wherein the said output of the restorer circuit comprises an impedance-matching circuit.

8. A restorer circuit according to claim 1, wherein the amplifier $A_1$ comprises a differential circuit having two paired field-effect transistors $T_1'$ and $T_2'$ in which the sources are joined together, the gate of the transistor $T_1'$ being such as to constitute the positive input and the gate of the transistor $T_2'$ being such as to constitute the negative input.

9. A restorer circuit according to claim 1, wherein the amplifier $A_2$ comprises a differential circuit having two paired field-effect transistors $T_3'$ and $T_4'$ in which the sources are joined together, the gate of the transistors $T_3'$ being such as to constitute the positive input and the gate of the transistor $T_4'$ being such as to constitute the negative input.

10. A restorer circuit according to claim 8, wherein the drains of the transistors $T'_2$ and $T'_4$ are connected together, the amplifier $A_3$ being connected to the drains of the transistors $T'_1$ and $T'_3$.

11. A restorer circuit according to claim 3, wherein the collectors of the transistors $T_2$ and $T_4$ are connected together, the amplifier $A_3$ being connected to the collectors of the transistors $T_1$ and $T_3$.

12. A restorer circuit according to claim 9, wherein the drains of the transistors $T'_2$ and $T'_4$ are connected together, the amplifier $A_3$ being connected to the drains of the transistors $T_1'$ and $T_3'$.

13. A restorer circuit according to claim 10, wherein the switch is constituted by a differential circuit having two transistors $T_5$ and $T_6$ in which the emitters are connected to a current source and in which the bases receive said control signal, the collector of the transistor $T_5$ being connected to the associated sources of the transistors $T_1'$ and $T_2'$ and the collector of the transistor $T_6$ being connected to the associated sources of the transistors $T'_3$ and $T'_4$.

14. A restorer circuit according to claim 12, wherein the switch is constituted by a differential circuit having two transistors $T_5$ and $T_6$ in which the emitters are connected to a current source and in which the bases receive said control signal, the collector of the transistor $T_5$ being connected to the associated sources of the transistors $T_1'$ and $T_2'$ and the collector of the transistor $T_6$ being connected to the associated sources of the transistors $T'_3$ and $T'_4$.

15. A restorer circuit according to claim 1, wherein the output of the restorer circuit is taken directly at the output of the amplifier $A_3$.

16. A restorer circuit according to claim 15, wherein the said output of the restorer circuit comprises an impedance-matching circuit.

* * * * *